United States Patent
Choi (10) Patent No.: US 11,631,445 B2
(45) Date of Patent: Apr. 18, 2023

(54) DATA OUTPUT APPARATUS AND SEMICONDUCTOR APPARATUS INCLUDING THE DATA OUTPUT APPARATUS

(71) Applicant: SK hynix Inc., Icheon-si (KR)

(72) Inventor: Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/340,777

(22) Filed: Jun. 7, 2021

(65) Prior Publication Data
US 2022/0223188 A1   Jul. 14, 2022

(30) Foreign Application Priority Data
Jan. 11, 2021   (KR) .................. 10-2021-0003121

(51) Int. Cl.
| | | |
|---|---|---|
| *G11C 7/22* | (2006.01) | |
| *G11C 7/10* | (2006.01) | |
| *H03L 7/081* | (2006.01) | |
| *H03L 7/099* | (2006.01) | |

(52) U.S. Cl.
CPC .............. *G11C 7/222* (2013.01); *G11C 7/106* (2013.01); *G11C 7/1066* (2013.01); *H03L 7/0818* (2013.01); *H03L 7/0992* (2013.01)

(58) Field of Classification Search
None
See application file for complete search history.

(56) References Cited

U.S. PATENT DOCUMENTS

| | | | | |
|---|---|---|---|---|
| 7,613,064 | B1 * | 11/2009 | Wagner | G11C 11/4074 365/222 |
| 2002/0041532 | A1 * | 4/2002 | Watanabe | G11C 29/02 365/219 |
| 2009/0279378 | A1 * | 11/2009 | Kwon | G11C 7/22 365/233.1 |
| 2009/0290445 | A1 * | 11/2009 | Kinoshita | G11C 7/1072 365/236 |
| 2009/0309629 | A1 * | 12/2009 | Samuel | G06F 13/122 345/531 |
| 2014/0253188 | A1 * | 9/2014 | Choi | H03K 23/42 327/115 |
| 2019/0140648 | A1 * | 5/2019 | Clark | H03K 19/1776 |
| 2019/0147927 | A1 * | 5/2019 | Jeon | G11C 29/50012 365/194 |
| 2019/0319779 | A1 * | 10/2019 | Jung | H03M 9/00 |
| 2021/0335403 | A1 * | 10/2021 | Choi | G11C 7/1057 |

FOREIGN PATENT DOCUMENTS

| | | |
|---|---|---|
| KR | 100725104 B1 | 6/2007 |
| KR | 1020110025757 A | 3/2011 |
| KR | 1020190124925 A | 11/2019 |

* cited by examiner

*Primary Examiner* — Michael T Tran
(74) *Attorney, Agent, or Firm* — William Park & Associates Ltd.

(57) ABSTRACT

A semiconductor apparatus includes a memory controller and data storage configured to input and output data in synchronization with a clock signal provided from the memory controller. The data storage includes a memory cell array and a data output apparatus configure to output read data from the memory cell array by sensing a logic level of the read data during a low-level period of a first clock, which is an inverted signal of a divided clock of the clock signal, and a low-level period of a second clock, the second clock having a set to phase delay amount from the divided clock.

17 Claims, 6 Drawing Sheets

DATA OUTPUT APPARATUS AND SEMICONDUCTOR APPARATUS INCLUDING THE DATA OUTPUT APPARATUS

CROSS-REFERENCES TO RELATED APPLICATION

The present application claims priority under 35 U.S.C. § 119(a) to Korean Patent Application Number 10-2021-0003121, filed on Jan. 11, 2021, in the Korean intellectual Property Office, which is incorporated herein by reference in its entirety.

BACKGROUND

1. Technical Field

Various embodiments may generally relate to a semiconductor apparatus, and more particularly, to a semiconductor apparatus and the semiconductor apparatus including a data output apparatus.

2. Related Art

With the demands for high-speed semiconductor systems, studies on high-speed operations of semiconductor apparatuses constituting the semiconductor systems and high-speed data transmission and reception between the semiconductor apparatuses have been conducted.

To improve operation speed of semiconductor apparatuses, the semiconductor apparatuses operate in synchronization with clock signals applied from the outsides of the semiconductor apparatuses.

The higher the speed of the clock signal, the operation speed of the semiconductor apparatus may be improved. However, as frequency of the clock signal is increased, it is difficult to accurately synchronize the semiconductor apparatus with the clock signal.

SUMMARY

In an embodiment of the present disclosure, a semiconductor apparatus may include: a memory controller and data storage configured to input and output data in synchronization with a clock signal provided from the memory controller. The data storage includes a memory cell array and a data output apparatus configure to output read data from the memory cell array by sensing a logic level of the read data during a low-level period of a first clock, which is an inverted signal of a divided clock of the clock signal, and a low-level period of a second clock, the second clock having a set phase delay amount from the divided clock.

In an embodiment of the present disclosure, a data output apparatus may include: a clock generation circuit configured to generate a plurality of divided clocks having different phases from each other in response to a clock signal provided from an external device; a trigger circuit configured to receive read data from a memory cell array and output a driving signal according to a logic level of the read data during a low-level period of a first clock, which is an inverted signal of each of the plurality of divided clocks, and a second clock delayed by a set phase delay amount from the divided clock; and a data output driver configured to generate output data by driving the read data according to a logic level of the driving signal.

BRIEF DESCRIPTION OF THE DRAWINGS

The above and other aspects, features and advantages of the subject matter of the present disclosure will be more dearly understood from the following detailed description taken in conjunction with the accompanying drawings, in which.

DETAILED DESCRIPTION

Various embodiments of the present teachings are described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Figure 1:
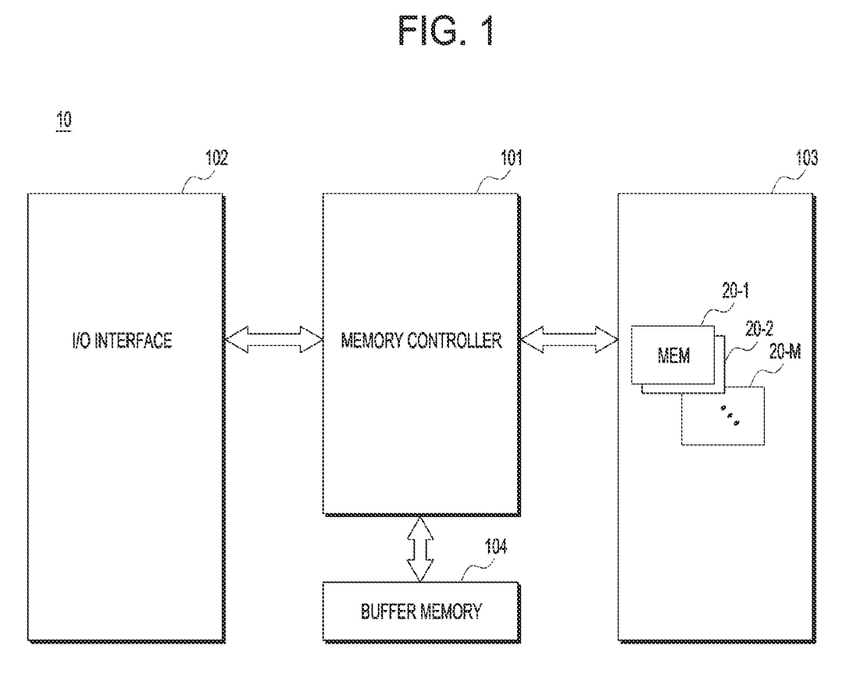
FIG. 1 is a diagram illustrating a configuration of a semiconductor apparatus according to an embodiment of the present disclosure.

FIG. 1 is a diagram illustrating a configuration of a semiconductor apparatus according to an embodiment.

Referring to FIG. 1, a semiconductor apparatus 10 according to an embodiment may include a memory controller 101, an input/output (I/O) interface 102, data storage 103, and a buffer memory 104.

The memory controller 101 may be configured to decode instructions applied from an external device (host device) through the I/O interface 102 and control data input and output from and to the data storage 103 and the buffer memory 104 according to the decoding results. For example, the memory controller 101 may control data to be programmed in the data storage 103 in response to a write request of the external device. The memory controller 101 may provide data stored in the data storage 103 to the host device in response to a read request of the external device.

The memory controller 101 may include a controller configured to control the data storage 103 and a controller configured to control the buffer memory 104.

The data storage 103 may operate in synchronization with a clock signal provided from the memory controller 101 and may store data or output stored data, according to control of the memory controller 101. The data storage 103 may be configured of a volatile memory device or a nonvolatile memory device. In an embodiment, the data storage 103 may be implemented using a memory device selected from various nonvolatile memory devices such as an electrically erasable and programmable read only memory (EEPROM), a NAND flash memory device, a NOR flash memory device, a phase-change random access memory (PRAM), a resistive random access memory (ReRAM), a ferroelectric random access memory (FRAM), and a spin torque transfer magnetic random access memory (STTRAM). In an embodiment, the data storage 103 may be implemented using a memory device selected from volatile memory devices such as a dynamic random access memory (DRAM), a mobile DRAM, and a static random access memory (SRAM).

The data storage 103 may include a plurality of semiconductor memory (MEM) devices 20-1, 20-2, . . . , and 20-M configured of a plurality of dies, a plurality of chips, or a plurality of packages. In an embodiment, 'M' may be an integer greater than 2.

The buffer memory 104 may serve as a space configured to temporarily store data when the semiconductor apparatus 10 performs a series of operations such as an operation of writing or reading data in conjunction with the external device. It has been illustrated in FIG. 1 that the buffer memory 104 is located outside the memory controller 101, but the buffer memory 104 may be included inside the memory controller 101.

The buffer memory 104 may be controlled through a buffer memory controller, for example a buffer manager (not shown) provided in the memory controller 101.

The buffer memory 104 may include a volatile memory device such as a DRAM, a mobile DRAM, and a SRAM.

The I/O interface 102 may provide a physical connection between the memory controller 101 and the external device (host device) so that the memory controller 101 may receive a control signal for data I/O from and to the external device and exchange data with the external device. The I/O interface 102 may include one of various standard interface protocols such as a universal serial bus (USB) protocol, an mufti-media card (MMC) protocol, an embedded MMC (eMMC) protocol, a personal computer memory card international association (PCMCIA) protocol, a parallel advanced technology attachment (DATA) protocol, a serial advanced technology attachment (SATA) protocol, a small computer system interface (SCSI) protocol, a serial attached SCSI (SAS) protocol, a peripheral component interconnection (PCI) protocol, and a PCI-express (PCI-E) protocol, a universal flash storage (UFS) protocol, an enhanced small disk interface (ESDI) protocol, and an integrated drive electronics (IDE) protocol.

The semiconductor apparatus 10 may be used as an auxiliary memory device or an external storage device of a host device mounted with the semiconductor apparatus 10. The semiconductor apparatus 10 may include a solid state drive (SSD), a USB memory, a secure digital card (SD), a mini secure digital card (mSD), a micro secure digital card (micro SD), a secure digital high capacity card (SDRC), a memory stick card, a smart media card (SM), a MMC card, an eMMC card, a compact flash (CF) card, and the like.

Figure 2:
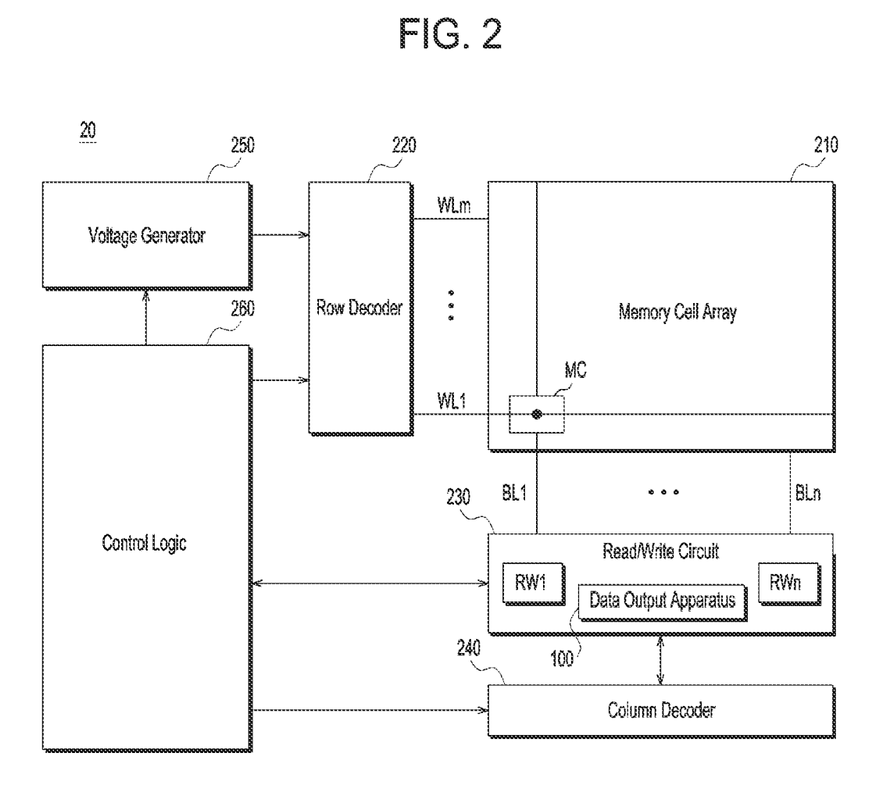
FIG. 2 is a diagram illustrating a configuration of a semiconductor memory device according to an embodiment of the present disclosure.

FIG. 2 is a diagram illustrating a configuration of a semiconductor memory device according to an embodiment. A flash memory device as an example of the semiconductor memory device is illustrated in FIG. 2.

Referring to FIG. 2, the semiconductor memory device 20 may include a memory cell array 210, a row decoder 220, a data read/write circuit 230, a column decoder 240, a voltage generator 250, and control logic 260. The control logic 260 may be implemented as hardware, software, or a combination of hardware and software. For example, the control logic 260 may be a control logic circuit operating in accordance with an algorithm and/or a processor executing control logic code.

The memory cell array 210 may include memory cells MG which are disposed in intersection regions of word lines WL1 to WLm and bit lines BL1 to BLn. In an embodiment, 'm' may be an integer greater than one and 'n' may be an integer greater than one.

The memory cell array 210 may include a three-dimensional (3D) memory array. The 3D memory array may extend vertically with respect to a flat surface of a semiconductor substrate and may have a structure including a NAND string in which at least one memory cell is vertically disposed over another memory cell. However, the 3D memory array is not limited to that structure. More generally, any memory array which has vertical as well as horizontal dimensions and a high degree of integration may be employed as the 3D memory array.

The row decoder 220 may be coupled with the memory cell array 210 through the word lines WL1 to WLm. The row decoder 220 may operate according to control of the control logic 260. The row decoder 220 may decode addresses provided from an external device (not shown). The row decoder 220 may select and drive the word lines WL1 to WLm, based on the decoding results. For example, the row decoder 220 may provide word line voltages provided from the voltage generator 250, to the word lines WL1 to WLm.

The data read/write circuit 230 may be coupled with the memory cell array 210 through the bit lines BL1 to BLn. The data read/write circuit 230 may include read/write circuits RW1 to RWn corresponding to the bit lines BL1 to BLn, respectively. The data read/write circuit 230 may operate according to control of the control logic 260. The data read/write circuit 230 may operate as a write driver or a sense amplifier according to an operation mode. For example, the data read/write circuit 230 may operate as the write driver which stores data provided from the external device, in the memory cell array 210 in a write operation. In another example, the data read/write circuit 230 may operate as the sense amplifier which reads out read data from the memory cell array 210 in a read operation.

The data read/write circuit 230 may include a data output apparatus (see 100 of FIG. 3) to be described.

The column decoder 240 may operate according to control of the control logic 260. The column decoder 240 may decode addresses provided from the external device. The column decoder 240 may couple data I/O lines (or data I/O buffers) with the read/write circuits RW1 to RWn of the data read/write circuit 230 which respectively correspond to the bit lines BL1 to BLn, based on the decoding results.

The voltage generator 250 may generate voltages to be used in operations of the semiconductor memory device 20. The voltages generated by the voltage generator 250 may be applied to the memory cells MC of the memory cell array 210, For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 260 may control an overall operation of the semiconductor memory device 20, based on control signals provided from the external device. For example, the control logic 260 may control read, write, and erase operations of the semiconductor memory device 20.

Figure 3:
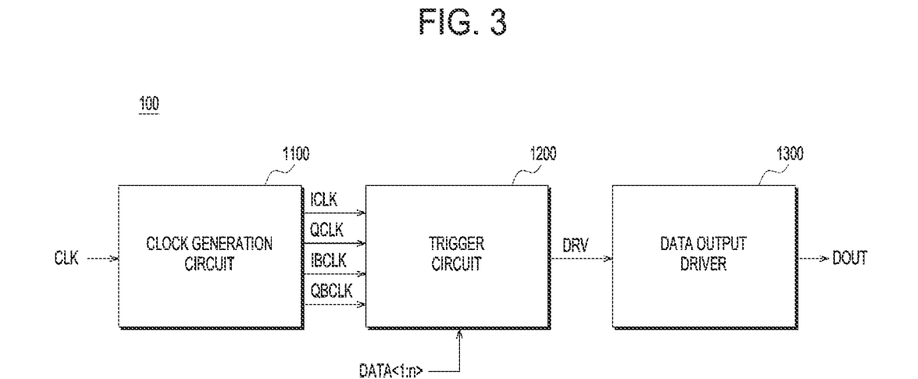
FIG. 3 is a diagram illustrating a configuration of a data output apparatus according to embodiments of the present disclosure.

FIG. 3 is a diagram illustrating a configuration of a data output apparatus according to an embodiment.

Referring to FIG. 3, the data output apparatus 100 according to an embodiment may include a clock generation circuit 1100, a trigger circuit 1200, and a data output driver 1300.

The clock generation circuit 1100 may generate a plurality of divided clocks ICLK, QCLK, IBCLK, and QBCLK having different phases from each other in response to an external clock signal CLK. The external clock signal CLK may be a toggling signal input from the outside of the semiconductor memory device 20, for example, the memory controller 101.

The plurality of divided clocks ICLK, QCLK, IBCLK, and QBCLK may include a first divided clock ICLK, a second divided clock QCLK, a third divided clock IBCLK, and a fourth divided clock QBCLK, but this is not limited thereto and the number of divided clocks may be varied according to implementation of the clock generation circuit 1100.

The divided clocks ICLK, QCLK, IBCLK, and QBCLK generated in the clock generation circuit 1100 may have frequency twice lower than the external clock signal CLK and may have a phase difference of 90 degrees.

The clock generation circuit 1100 may include a frequency division circuit including a phase-locked loop (PLL), a delay-locked loop (DLL), and the like.

The trigger circuit 1200 may receive plural-bit data DATA<1:n> transmitted, for example, through a global I/O line (not shown) and output a driving signal DRV according to a logic level of the data DATA<1:n>, in synchronization with the first to fourth divided clocks ICLK, QCLK, IBCLK, and QBCLK.

The data output driver 1300 may generate output data GOUT according to a logic level of the driving signal DRV, and provide the output data DOUT to an external device, for example, the memory controller 101 through an I/O pad (not shown). In an embodiment, the data output driver 1300 may be configured to generate output data DOUT by driving read data according to a logic level of the driving signal DRV.

In particular, the trigger circuit 1200 according to the technology may be configured to sense the logic level of the data DATA<1:n> during a time that a low-level period of a first clock coincides with a low-level period of a second clock, by setting an inverted signal of each of the first to the fourth divided clocks ICLK, QCLK, IBCLK, and QBCLK as the first clock and a signal having a set phase delay amount to each divided clock as the second clock, Here, the set phase delay amount may be [360 degrees/number of divided clocks]. For example, when the clock generation circuit 1100 divides the external clock signal CLK into four clocks, the phase difference between the first clock and the second clock may be 90 degrees. For example, when the clock generation circuit 1100 divides the external clock signal CLK into X clocks, the phase difference between the X number of divided clocks are all equal. In an embodiment X is an integer greater than or equal to 2.

In an embodiment, the trigger circuit 1200 may drive first data DATA<1> using an inverted signal of the first divided clock ICLK as a first clock CLK_INV and a signal having a phase delayed by 90 degrees from the first divided clock ICLK (for example, second divided clock QCLK) as a second clock CLK90. Similarly, the trigger circuit 1200 may drive second data DATA<2> using an inverted signal of the second divided clock QCLK as the first clock CLK_INV and a signal having a phase delayed by 90 degrees from the second divided clock QCLK (for example, third divided clock IBCLK) as the second clock CLK90. The trigger circuit 1200 may drive third data DATA<3> using an inverted signal of the third divided clock IBCLK as the first clock CLK_INV and a signal having a phase delayed by 90 degrees from the third divided clock IBCLK (for example, fourth divided clock QBCLK) as the second clock CLK90. The trigger circuit 1200 may drive fourth data DATA<4> using an inverted signal of the fourth divided clock QBCLK as the first clock CLK_INV and a signal having a phase delayed by 90 degrees from the fourth divided clock QBCLK (for example, first divided clock ICLK) as the second clock CLK90.

As the logic level of the data DATA<1:n> is sensed during the time that a low-level period of the first clock as the inverted signal of the divided clock coincides with a low-level period of the second clock having a set phase delay amount to the divided clock, the sensing timing may be advanced as compared to sensing of the data in a high-level period of the divided clocks.

Through the timing margin for inverting the divided clock, sensing periods of continuously input data may be prevented from overlapping each other or mitigated rom overlapping with each other.

Figure 4:
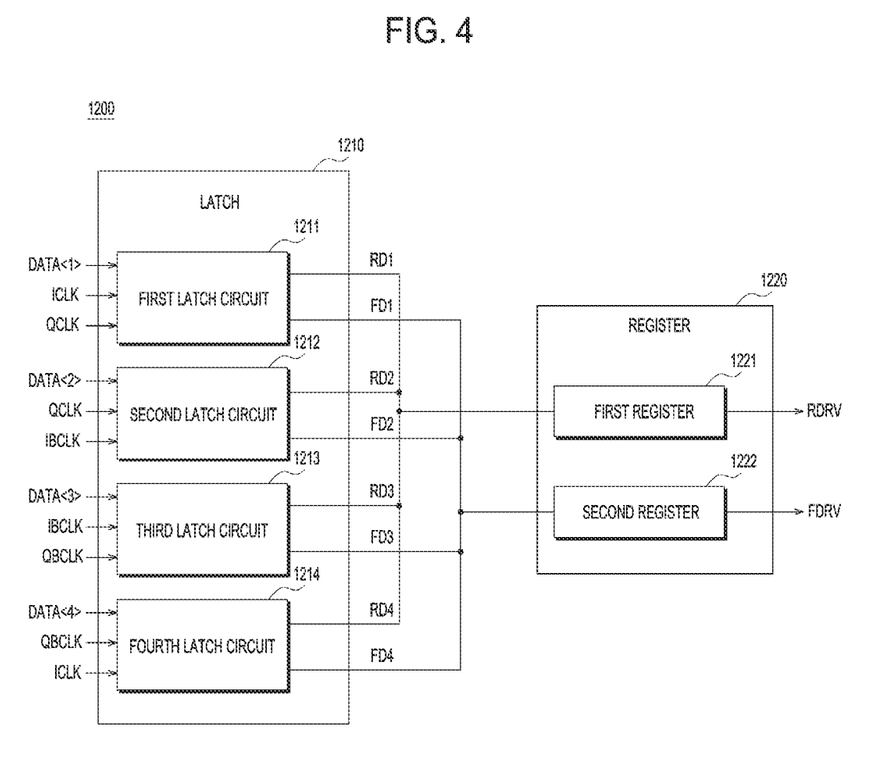
FIG. 4 is a diagram illustrating a configuration of a trigger circuit according to embodiments of the present disclosure.

FIG. 4 is a diagram illustrating a configuration of a trigger circuit according to an embodiment.

Referring to FIG. 4, the trigger circuit 1200 according to an embodiment may include a latch 1210 and a register 1220.

The latch 1210 may include a plurality of latch circuits 1211, 1212, 1213, and 1214 configured to sense the logic levels of the data DATA<1>, DATA<2>, DATA<3>, and DATA<4> during the time that the low-level period of the first clock coincides with the low-level period of the second clock, using the inverted signal of each of the divided clocks ICLK, QCLK, IBCLK, and QBCLK as the first clock and the signal having the set phase delay amount to the divided clock as the second clock.

The first latch circuit 1211 may output rising first data RD1 and falling first data FD1 by sensing the first data DATA<1> using the inverted signal of the first divided clock ICLK as the first clock CLK_INV and the signal having the phase delayed by 90 degrees from the first divided clock ICLK, for example, the second divided clock QCLK as the second clock CLK90.

The second latch circuit 1212 may output rising second data RD2 and falling second data FD2 by sensing the second data DATA<2> using the inverted signal of the second divided clock QCLK as the first clock CLK_INV and the signal having the phase delayed by 90 degrees from the second divided clock QCLK, for example, the third divided clock IBCLK as the second clock CLK90.

The third latch circuit 1213 may output rising third data RD3 and falling third data FD3 by sensing the third data DATA<3> using the inverted signal of the third divided clock IBCLK as the first clock CLK_INV and the signal having the phase delayed by 90 degrees from the third divided clock IBCLK, for example, the fourth divided clock QBCLK as the second clock CLK90.

The fourth latch circuit 1214 may output rising fourth data RD4 and falling fourth data FD4 by sensing the fourth data DATA<4> using the inverted signal of the fourth divided clock QBCLK as the first clock CLK_INV and the signal having the phase delayed by 90 degrees from the fourth divided clock QBCLK, for example, the first divided clock ICLK as the second clock CLK90.

The register 1220 may output the driving signal DRV according to logic levels of the rising data RD1 to RD4 and the falling data FD1 to FD4 sensed through the latch 1210. In an embodiment, the driving signal DRV may include a rising driving signal RDRV and a falling driving signal FDRV. The register 1220 may include a first register 1221 configured to output the rising driving signal RDRV by driving the rising data RD1 to RD4 and a second register 1222 configured to output the falling driving signal FDRV by driving the falling data FD1 to FD4.

Figure 5:
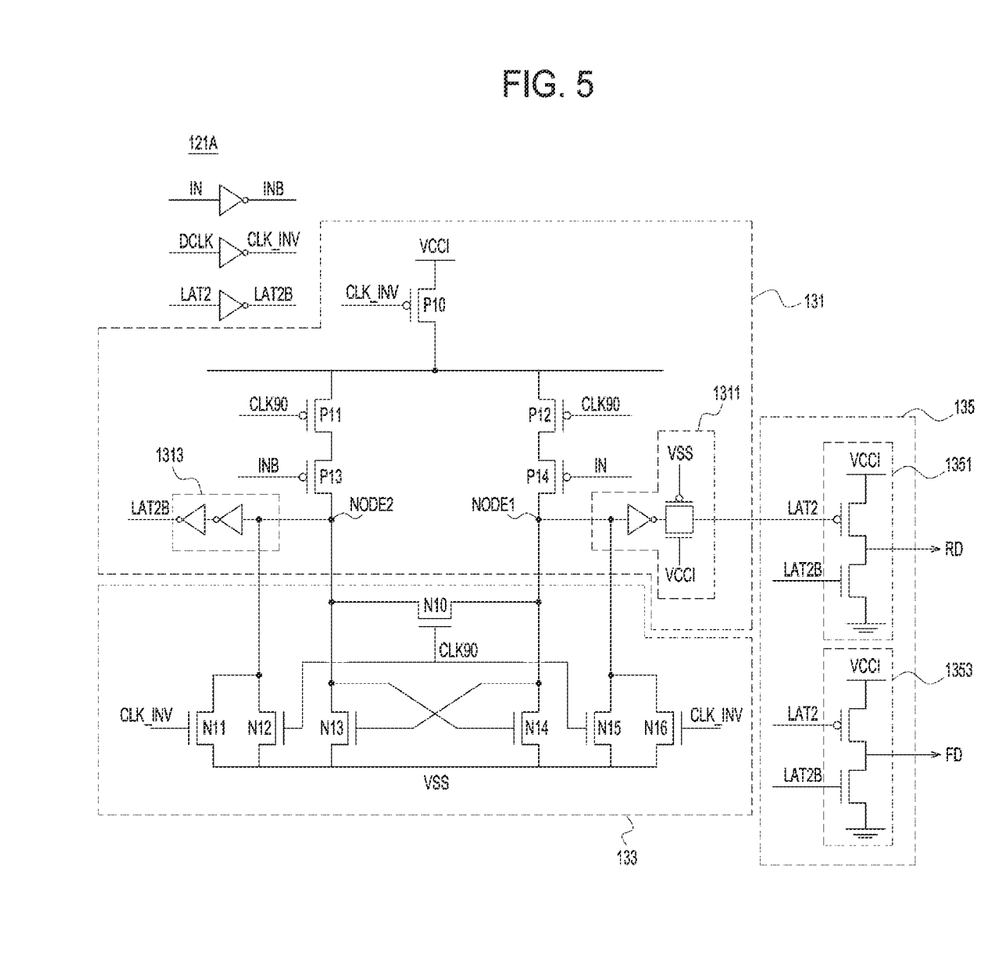
FIG. 5 is a diagram illustrating a configuration of a latch circuit according to an embodiment of the present disclosure.

FIG. 5 is a diagram illustrating a configuration of a latch circuit according to an embodiment.

FIG. 5 illustrates a latch circuit 121A according to an embodiment, and the first to fourth latch circuits 1211 to 1214 illustrated in FIG. 4 may have the same configuration as the latch circuit 121A.

Referring to FIG. 5, the latch circuit 121A may include a sensor 131, a charging circuit 133, and an outputter 135.

During the time that the low-level period of the first clock CLK_INV coincides with the low-level period of the second clock CLK90, using an inverted signal of a divided clock DCLK as the first clock CLK_INV and a signal having a set phase delay amount to the divided clock DCLK as the second clock CLK90, the sensor 131 may sense logic levels of data IN and INB and apply signals corresponding to the sensed logic levels to a first output node NODE1 and a second output node NODE2, and may sense the signals applied to the first output node NODE1 and the second output node NODE2 and output the sensed signals as latch signals LAT2 and LAT2B.

The charging circuit 133 may charge or discharge potentials of the first and second output nodes NODE1 and NODE2 of the sensor 131 in response to the first clock CLK_INV and the second clock CLK90.

The outputter 135 may output rising data RD and falling data FD in response to the latch signals LAT2 and LAT2B.

In an embodiment, the sensor 131 may include a first P-type transistor P10 configured to supply a power voltage (CCI in response to the first clock. CLK_INV, second and third P-type transistors P11 and P12 configured to supply sensing voltages in response to the second clock CLKYO, and fourth and fifth P-type transistors P13 and P14 configured to apply sensing voltages to the output nodes NODE1 and NODE2 according to the logic levels of the data IN and INB.

The sensor 131 may further include a first latch 1311 and a second latch 1313. The first latch 1311 may generate the first latch signal LAT2 by inverting and driving first sensing data applied to the first output node NODE1, for example, a potential of the first output node NODE1. In an embodiment, the first sensing data applied to the first output node NODE1 may be inverted then driven with a ground voltage VSS and the power voltage VCCI.

The second latch circuit 1313 may generate the second latch signal LAT2B by driving second sensing data applied to the second output node NODE2, for example, a potential of the second output node NODE2. In an embodiment, the second sensing data applied to the second output node NODE2 may be inverted then driven with a ground voltage VSS and the power voltage VCCI.

In an embodiment, the charging circuit 133 may include first to seventh N-type transistors N10 to N16 configured to maintain or discharge the potentials of the output nodes NODE1 and NODE2 in response to the first clock CLK_INV and the second clock CLK9O.

While the sensor 131 senses the data IN and INB in a section that the low-level period of the first clock CLK_INV coincides with the low-level period of the second clock CLK90 the charging circuit 133 may maintain the potentials of the output nodes NODE1 and NODE2, and when the latch signals LAT2 and LAT2B generated in the sensor 131 are transmitted to the outputter 135, the output nodes NODE1 and NODE2 may be discharged by the charging circuit 133.

In an embodiment, the outputter 135 may include a first outputter 1351 configured to output the rising data RD in response to the first latch signal LAT2 and the second latch signal LAT2B, and a second outputter 1353 configured to output the falling data FD in response to the first latch signal LAT2 and the second latch signal LAT2B received from the sensor 131.

As the first to fourth latch circuits 1211 to 1214 illustrated in FIG. 4 have the same configuration as the latch circuit 121A illustrated in FIG. 5, the first to fourth data DATA<1>, DATA<2>, DATA<3>, and DATA<4> may be sequentially sensed through the first to fourth latch circuits 1211 to 1214.

Figure 6:
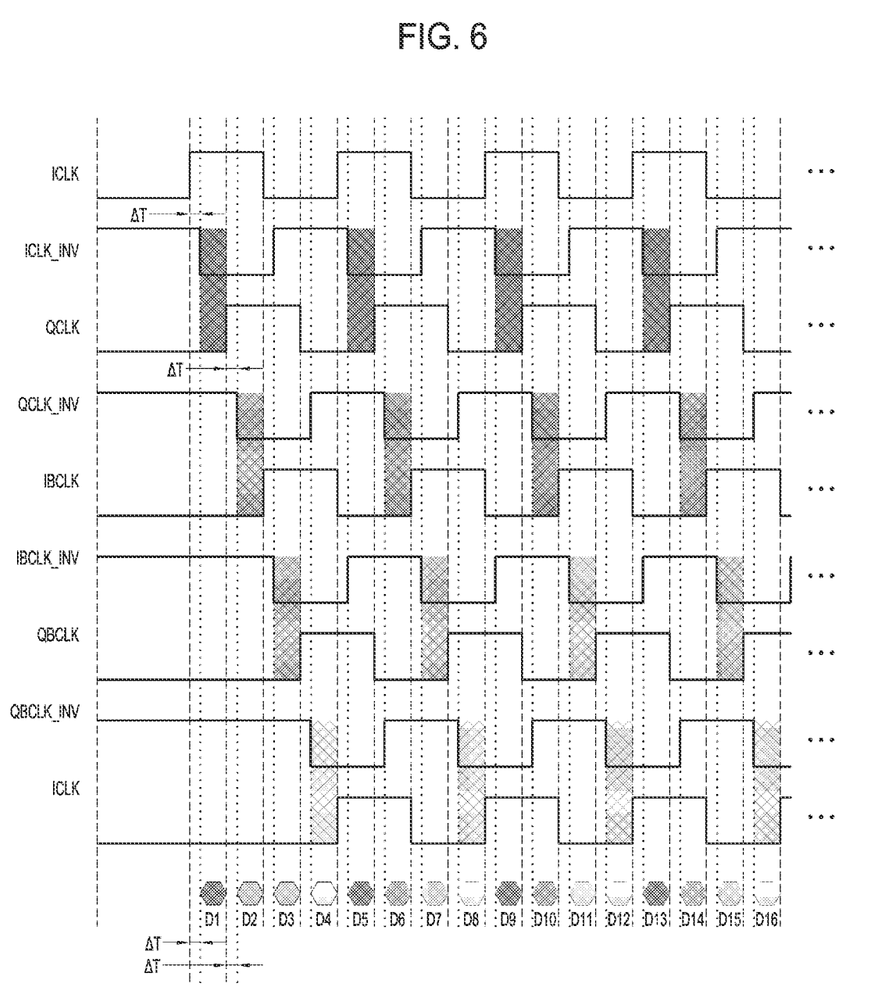
FIG. 6 is a timing diagram explaining an operation of a data output apparatus according to an embodiment of the present disclosure.

FIG. 6 is a timing diagram explaining an operation of a data output apparatus according to an embodiment.

As shown in FIG. 6, the first latch circuit 1211 may sense first data D1 during the time that the low-level period of the first clock CLK_INV coincides with the low-level period of the second divided clock QCLK. During this time of coinciding, the low-level period of the first clock CLK_INV is an inverted signal ICLK_INV of the first divided clock ICLK, and the low-level period of the second clock CLK90 is the second divided clock QCLK having the phase delayed by 90 degrees from the first divided clock ICLK. In an embodiment, D1 to D16 may be first data DATA<1> to sixteenth data DATA<16>, respectively.

As shown in FIG. 6, the second latch circuit 1212 may sense second data D2 during the time that the low-level period of the first clock CLK_INV coincides with the low-level period of the third divided clock IBCLK, During this time of coinciding, the low-level period of the first clock CLK_INV is an inverted signal QCLK_INV of the second divided clock QCLK, and the low-level period of the second clock CLK90 is the third divided clock IBCLK having the phase delayed by 90 degrees from the second divided clock QCLK.

As shown in FIG. 6, the third latch circuit 1213 may sense third data D3 during the time that the low-level period of the first clock CLK_INV coincides with the low-level period of the fourth divided clock QBCLK. During this time of coinciding, the low-level period of the first clock CLK_INV is an inverted signal IBCLK_INV of the third divided clock IBCLK, and the low-level period of the second clock CLK90 is the fourth divided clock QBCLK having the phase delayed by 90 degrees from the third divided clock IBCLK.

As shown in FIG. 6, the fourth latch circuit 1214 may sense fourth data D4 during the time that the low-level period of the first clock CLK_INV coincides with the low-level period of the first divided clock ICLK, During this time of coinciding, the low-level period of the first clock CLK_INV is an inverted signal QBCLK_INV of the fourth divided clock QBCLK, and the low-level period of the second clock CLK90 is the first divided clock ICLK having the phase delayed by 90 degrees from the fourth divided clock QBCLK.

The data sensing timing may be advanced as compared to sensing of the data in a high-level period of each of the divided clocks ICLK, QCLK, IBCLK, and QBCLK and the phase-delayed clock of each divided clock by 90 degrees without inverting of the divided clocks ICLK, QCLK, IBCLK, and QBCLK.

Since the timing margin corresponding to a time ΔT for inverting each of the divided clocks ICLK, QCLK, IBCLK, and QBCLK in the latch circuits 1211 to 1214 is generated, the sensing periods of continuously input data D1 to D16 may be prevented from overlapping each other or mitigated from overlapping with each other.

Figure 7:
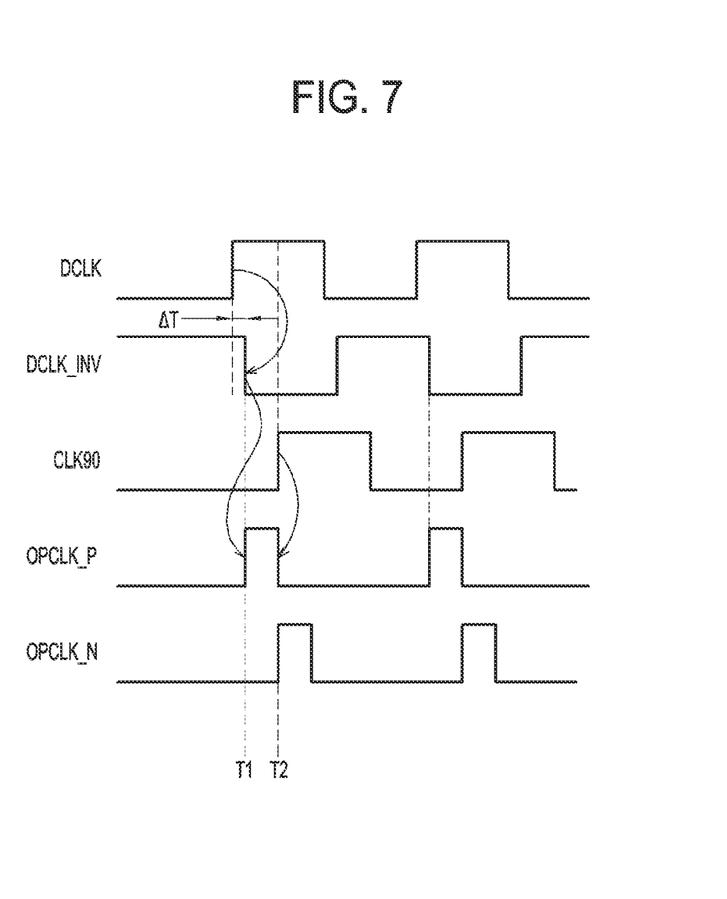
FIG. 7 is a timing diagram explaining data sensing timing according to embodiments of the present disclosure.

FIG. 7 is a timing diagram explaining data sensing timing according to an embodiment.

Referring to FIG. 7, data may be sensed during a sensing period OPCLK_P set from a first timing T1 that the low-level period of the first clock DCLK INV that the divided clock DCLK is inverted coincides with the low-level period of the second clock CLK90 having the phase delayed by 90 degrees from the divided clock DCLK.

Accordingly, since the sensing timing is advanced from a second timing T2 to the first timing T1 as compared to sensing of data during a sensing period OPCLK_N set from the second timing T2 that the high-level period of the divided clock DCLK coincides with the high-level period of the second clock CLK90 having the phase delayed by 90 degrees from the divided clock DCLK, data output speed may be improved.

Further, collision between continuously sensed data may be prevented or mitigated due to the timing margin ΔT corresponding to the time for generating the first clock CLK_INV by inverting the divided clock DCLK.

The above described embodiments of the present disclosure are intended to illustrate and not to limit the embodiments, Various alternatives and equivalents are possible. The embodiments is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor apparatus comprising:
a memory controller; and
data storage configured to input and output data in synchronization with a clock signal provided from the memory controller,
wherein the data storage includes:
a memory cell array; and
a data output apparatus configured to output read data from the memory cell array by sensing a logic level of the read data during a low-level period of a first clock, which is an inverted signal of a divided clock of the clock signal, coincides with a low-level period of a second clock, the second clock having a set phase delay amount from the divided clock.

2. The semiconductor apparatus of claim 1, wherein the data output apparatus includes:
a clock generation circuit configured to generate a plurality of divided clocks having different phases from each other in response to the clock signal;
a trigger circuit configure to receive the read data and output a driving signal according to a logic level of the read data in synchronization with the first clock and the second clock; and
a data output driver configured to generate output data by driving the read data according to a logic level of the driving signal.

3. The semiconductor apparatus of claim 2, wherein the divided clock has lower frequency than the clock signal.

4. The semiconductor apparatus of claim 2, wherein a phase difference between the divided clocks is set to 360 degrees/number of divided clocks.

5. The semiconductor apparatus of claim 2, wherein the clock generation circuit is configured to generate a first divided clock having lower frequency than the clock signal, a second divided clock delayed by the set phase delay amount from the first divided clock, a third divided clock delayed by the set phase delay amount from the second divided clock, and a fourth divided clock delayed by the set phase delay amount from the third divided clock.

6. The semiconductor apparatus of claim 5, wherein the trigger circuit includes:
a first latch circuit configured to sense first read data in synchronization with an inverted signal of the first divided clock and the second divided clock;
a second latch circuit configured to sense second read data in synchronization with an inverted signal of the second divided clock and the third divided clock;
a third latch circuit configured to sense third read data in synchronization with an inverted signal of the third divided clock and the fourth divided clock; and
a fourth latch circuit configured to sense fourth read data in synchronization with an inverted signal of the fourth divided clock and the first divided clock.

7. The semiconductor apparatus of claim 2, wherein the trigger circuit includes:
a sensor configured to apply a first latch signal corresponding to the logic level of the read data to a first output node and apply a second latch signal corresponding to the logic level of the read data to a second output node, by sensing the logic level of the read data during the low-level period of the first clock coincides with the low-level period of the second clock;
a charging circuit configured to maintain or discharge potentials of the first output node and the second output node in response to the first clock and the second clock; and
an outputter configured to output rising data and falling data in response to the first latch signal and the second latch signal.

8. The semiconductor apparatus of claim 7, wherein the driving signal includes a rising driving signal and a falling driving signal, and
the trigger circuit further includes:
a first register configured to output the rising driving signal in response to the rising data; and
a second register configured to output the falling driving signal in response to the falling data.

9. A data output apparatus comprising:
a clock generation circuit configured to generate a plurality of divided clocks having different phases from each other in response to a clock signal provided from an external device;
a trigger circuit configured to receive read data from a memory cell array and output a driving signal according to a logic level of the read data during a low-level period of a first clock, which is an inverted signal of each of the plurality of divided clocks, coincides with a low-level period of a second clock delayed by a set phase delay amount from the divided clock; and a data output driver configured to generate output data by driving the read data according to a logic level of the driving signal.

10. The data output apparatus of claim 9, wherein each of the divided clocks have a lower frequency than the clock signal.

11. The data output apparatus of claim 9, wherein a phase difference between the divided clocks is set to 360 degrees/number of divided clocks.

12. The data output apparatus of claim 9, wherein the clock generation circuit is configured to generate a first divided clock having lower frequency than the clock signal, a second divided clock delayed by the set phase delay amount from the first divided clock, a third divided clock delayed by the set phase delay amount from the second divided clock, and a fourth divided clock delayed by the set phase delay amount from the third divided clock.

13. The data output apparatus of claim 12, wherein the trigger circuit includes:
a latch configured to output a latch signal by sensing the logic level of the read data during the low-level period of the first clock coincides with the low-level period of the second clock with respect to each of the first to fourth divided clocks; and
a register configured to output the driving signal according to a logic level of the latch signal.

14. The data output apparatus of claim 13, wherein the latch includes:
a first latch circuit configured to sense first read data in synchronization with an inverted signal of the first divided clock and the second divided clock;
a second latch circuit configured to sense second read data in synchronization with an inverted signal of the second divided clock and the third divided clock;
a third latch circuit configured to sense third read data in synchronization with an inverted signal of the third divided clock and the fourth divided clock; and
a fourth latch circuit configured to sense fourth read data in synchronization with an inverted signal of the fourth divided clock and the first divided clock.

15. The data output apparatus of claim 9, wherein the trigger circuit includes:
a sensor configured to apply a latch signal, which is generated by sensing the logic level of the read data, to an output node during the low-level period of the first clock coincides with the low-level period of the second clock;
a charging circuit configured to maintain or discharge a potential of the output node in response to the first clock and the second clock; and
an outputter configured to output the driving signal in response to the latch signal.

16. The data output apparatus of claim 15, wherein the sensor includes a first latch configured to apply a first latch signal corresponding to the logic level of the read data to a first output node; and a second latch configured to apply a second latch signal corresponding to the logic level of the read data to a second output node, and
the outputter is configured to output rising data and falling data in response to the first latch signal and the second latch signal.

17. The data output apparatus of claim 16, wherein the driving signal includes a rising driving signal and a falling driving signal, and
the trigger circuit further includes:
a first register configured to output the rising driving signal in response to the rising data; and
a second register configured to output the falling driving signal in response to the falling data.

* * * * *